(12) United States Patent
Shiragami et al.

(10) Patent No.: US 10,377,086 B2
(45) Date of Patent: Aug. 13, 2019

(54) MANUFACTURING METHOD FOR AIRTIGHT PACKAGE

(71) Applicant: Nippon Electric Glass Co., Ltd., Shiga (JP)

(72) Inventors: Toru Shiragami, Shiga (JP); Hiroshi Arakawa, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 15/576,922

(22) PCT Filed: May 16, 2016

(86) PCT No.: PCT/JP2016/064434
§ 371 (c)(1),
(2) Date: Nov. 27, 2017

(87) PCT Pub. No.: WO2016/190149
PCT Pub. Date: Dec. 1, 2016

(65) Prior Publication Data
US 2018/0147787 A1    May 31, 2018

(30) Foreign Application Priority Data
May 28, 2015   (JP) ................................. 2015-108176

(51) Int. Cl.
*B29C 65/16*   (2006.01)
*B29C 65/48*   (2006.01)
(Continued)

(52) U.S. Cl.
CPC .............. *B29C 65/16* (2013.01); *B29C 65/48* (2013.01); *B32B 17/00* (2013.01); *C03C 8/24* (2013.01);
(Continued)

(58) Field of Classification Search
CPC ......... B32B 17/00; B29C 65/48; B29C 65/16; C03C 8/24
See application file for complete search history.

(56) References Cited

U.S. PATENT DOCUMENTS

2005/0179362 A1*  8/2005  Kijima ...................... H01J 5/24
                                                          313/495
2010/0001361 A1   1/2010  Caplet et al.

FOREIGN PATENT DOCUMENTS

JP    2008-186697    8/2008
JP    2010-12595     1/2010
(Continued)

OTHER PUBLICATIONS

Machine Translation of JP-2011182155-A (Year: 2011).*
(Continued)

*Primary Examiner* — Daniel McNally
(74) *Attorney, Agent, or Firm* — Wenderoth, Lind & Ponack, L.L.P.

(57) ABSTRACT

A method of producing a hermetic package includes forming a first sealing material layer on a first glass substrate, and arranging a frame body having an opening on its top so that a bottom portion of the frame body and the first sealing material layer are in contact, followed by sealing the frame body and the first glass substrate with each other via the first sealing material layer. The method further includes forming a second sealing material layer on an upper edge portion of the frame body, housing, in the frame body, a member, and arranging a second glass substrate to be in contact with the second sealing material layer, followed by sealing the second glass substrate and the frame body with each other via the second sealing material layer by irradiating the second sealing material layer with laser light from a second glass substrate side.

19 Claims, 2 Drawing Sheets

(51) Int. Cl.
*C03C 8/24* (2006.01)
*H01L 41/053* (2006.01)
*H01L 41/23* (2013.01)
*B32B 17/00* (2006.01)
*B29L 31/00* (2006.01)
*H03H 9/10* (2006.01)

(52) U.S. Cl.
CPC ............ *H01L 41/053* (2013.01); *H01L 41/23* (2013.01); *B29L 2031/712* (2013.01); *C03C 2207/00* (2013.01); *H03H 9/10* (2013.01); *H03H 9/1014* (2013.01)

(56) References Cited

FOREIGN PATENT DOCUMENTS

| JP | 2011-182155 | | | 9/2011 |
|---|---|---|---|---|
| JP | 2011182155 | A | * | 9/2011 |
| JP | 2012-14971 | | | 1/2012 |
| JP | 2012014971 | A | * | 1/2012 |
| JP | 2015-23263 | | | 2/2015 |
| JP | 2015023263 | A | * | 2/2015 |

OTHER PUBLICATIONS

Machine Translation of JP-2015023263-A (Year: 2015).*
International Preliminary Report on Patentability and Written Opinion of the International Searching Authority dated Nov. 28, 2017 in International (PCT) Application No. PCT/JP2016/064434.
International Search Report dated Jul. 5, 2016 in International (PCT) Application No. PCT/JP2016/064434.
Chinese Office Action dated Jan. 28, 2019 in corresponding Chinese Patent Application No. 201680015812.0 with English Translation of Search Report.

* cited by examiner

MANUFACTURING METHOD FOR AIRTIGHT PACKAGE

TECHNICAL FIELD

The present invention relates to a method of producing a hermetic package through sealing treatment using laser light (hereinafter referred to as "laser sealing").

BACKGROUND ART

For a hermetic package, extensive investigations have been made on maintaining characteristics and prolonging a lifetime. For example, a piezoelectric vibrator element is a sensitive element that is easily degraded through exposure to oxygen and moisture in its surrounding environment. In view of this, there has been an attempt to hermetically incorporate the piezoelectric vibrator element into a piezoelectric vibrator package, to thereby maintain the characteristics of the piezoelectric vibrator package and prolong the lifetime of the package.

As a hermetic structure of the piezoelectric vibrator package, the following hermetic structure has been investigated: a hermetic structure in which a glass substrate is arranged above an element base on which a piezoelectric vibrator element is arranged so that the glass substrate is spaced apart from and faces the element base, and under such state, the space between the glass substrate and the element base is sealed with a sealing material layer so that the piezoelectric vibrator element is surrounded by the sealing material layer. Ceramic, for example, alumina is generally used as the element base.

However, it has been known that the piezoelectric vibrator element has low heat resistance. Therefore, when the element base and the glass substrate are sealed with each other through firing in a temperature range in which the sealing material layer softens and flows, there is a risk in that the characteristics of the piezoelectric vibrator element are thermally degraded.

CITATION LIST

Patent Literature 1: JP 2008-186697 A

SUMMARY OF INVENTION

Technical Problem

In recent years, laser sealing has been investigated as a method of sealing the hermetic package. The laser sealing can locally heat only the sites to be sealed, and hence the element base and the glass substrate can be sealed with each other while thermal degradation of the element having low heat resistance or the like is prevented.

Meanwhile, through the laser sealing, it is difficult to increase sealing strength between the element base and the glass substrate. In addition, when the element base is formed of ceramic, it is more difficult to increase the sealing strength between the element base and the glass substrate.

Specifically, the laser sealing is a method involving locally heating the sealing material layer to cause the sealing material layer to soften and flow. Therefore, a time period required for the laser sealing is shortened, and along with this, reaction time of the sealing material layer is also shortened. As a result, a reaction layer is not sufficiently generated at an interface of the sealing material layer, and the sealing strength between the element base and the glass substrate is decreased.

The present invention has been made in view of the above-mentioned circumstances, and a technical object of the present invention is to devise a method by which sealing strength of a hermetic package in its entirety can be increased while thermal degradation of a member to be housed is prevented, to thereby improve long-term reliability of the hermetic package.

Solution to Problem

As a result of extensive investigations, the inventors of the present invention have found that the above-mentioned technical object can be achieved by the following: a pair of glass substrates are prepared, one of the glass substrates and a frame body are sealed with each other, and further, a sealing material layer is formed in advance on an upper edge portion of the frame body, and then, a member to be housed is housed in the frame body, and further, the other glass substrate and the frame body are sealed with each other with laser. Thus, the finding is proposed as the present invention. That is, a method of producing a hermetic package according to one embodiment of the present invention comprises the steps of: (1) preparing a first glass substrate and forming a first sealing material layer on the first glass substrate; (2) preparing a frame body having an opening on top thereof and arranging the frame body and the first glass substrate so that a bottom portion of the frame body and the first sealing material layer are brought into contact with each other, followed by sealing the frame body and the first glass substrate with each other through intermediation of the first sealing material layer; (3) forming a second sealing material layer on an upper edge portion of the frame body; (4) housing, in the frame body, a member to be housed; and (5) preparing a second glass substrate and arranging the second glass substrate so that the second glass substrate and the second sealing material layer are brought into contact with each other, followed by sealing the second glass substrate and the frame body with each other through intermediation of the second sealing material layer by irradiating the second sealing material layer with laser light from a second glass substrate side, to thereby provide a hermetic package.

A sealing material generally comprises low-melting-point glass. At the time of laser sealing, the low-melting-point glass erodes a surface layer of an object to be sealed to generate a reaction layer. When the object to be sealed is glass, the reaction layer is generated to some extent through the laser sealing, and thus bonding strength can be ensured. However, when the object to be sealed is ceramic, the low-melting-point glass hardly erodes the surface layer of the ceramic at the time of laser sealing, and the reaction layer is not generated sufficiently. That is, when the object to be sealed is glass, the reaction layer can be generated through the laser sealing, but when the object to be sealed is ceramic, it is difficult to generate the reaction layer through the laser sealing. In view of the foregoing, in the method of producing a hermetic package according to the embodiment of the present invention, the second sealing material layer is first formed on the frame body through firing or the like, and the second sealing material layer and the second glass substrate are then sealed with each other with laser. With this, a reaction layer is sufficiently generated between the frame body and the second sealing material layer, and thus the second sealing material layer is firmly bonded to the frame body. In addition, at the time of laser sealing, an object to be sealed is glass. As a result, a reaction layer is generated between the second glass substrate and the second sealing material layer, and thus the second sealing material layer is firmly bonded to the glass substrate as well.

Secondly, in the method of producing a hermetic package according to the embodiment of the present invention, the forming a first sealing material layer preferably comprises applying a paste containing a first sealing material onto the first glass substrate, followed by firing, to thereby form a first sealing material layer formed of a sintered body of the first sealing material. With this, bonding strength between the first glass substrate and the first sealing material layer can be increased. In addition, the thickness of the first sealing material layer can be reduced.

Thirdly, the method of producing a hermetic package according to the embodiment of the present invention preferably comprises using, as a first sealing material, a sealing material comprising 55 vol % to 95 vol % of bismuth-based glass powder and 5 vol % to 45 vol % of refractory filler powder. Bismuth-based glass has good reactivity to an object to be sealed, in particular, ceramic as compared to glasses based on other materials. With this, the bonding strength between the first glass substrate and the first sealing material layer can be increased. Further, when the refractory filler powder is introduced, the thermal expansion coefficients of the first glass substrate and the first sealing material layer can match each other. The "bismuth-based glass" refers to glass comprising $Bi_2O_3$ as a main component, and specifically refers to glass comprising 40 mass % or more of $Bi_2O_3$ in a glass composition.

Fourthly, the method of producing a hermetic package according to the embodiment of the present invention preferably comprises using, as the frame body, a sintered body of a green sheet. With this, dimensional accuracy and heat resistance of the frame body can be increased.

Fifthly, in the method of producing a hermetic package according to the embodiment of the present invention, the sealing the frame body and the first glass substrate with each other preferably comprises firing the first sealing material layer. With this, sealing strength between the frame body and the first glass substrate can be increased.

Sixthly, in the method of producing a hermetic package according to the embodiment of the present invention, the forming a first sealing material layer preferably comprises applying a paste containing a second sealing material onto the upper edge portion of the frame body, followed by firing, to thereby form a second sealing material layer formed of a sintered body of the second sealing material. With this, bonding strength between the second sealing material layer and the frame body can be increased. In addition, the thickness of the second sealing material layer can be reduced.

Seventhly, the method of producing a hermetic package according to the embodiment of the present invention preferably comprises using, as the second sealing material, a sealing material comprising 55 vol % to 95 vol % of bismuth-based glass powder, 5 vol % to 45 vol % of refractory filler powder, and 1 vol % to 15 vol % of a heat-resistant pigment. Bismuth-based glass has high thermal stability (devitrification resistance) while having a low melting point. With this, the sealing material softens and flows successfully at the time of laser sealing, and hence accuracy of the laser sealing can be improved. In addition, when the refractory filler powder is introduced, the thermal expansion coefficients of the second sealing material layer and the frame body can match each other. Further, when the heat-resistant pigment is introduced, laser light absorption properties can be improved.

Eighthly, in the method of producing a hermetic package according to the embodiment of the present invention, the second sealing material layer preferably has an average thickness of less than 10 µm. With this, the second sealing material layer can easily be locally heated in its entirety through the laser sealing, and hence the bonding strength between the frame body and the second sealing material layer can be increased.

Ninthly, the method of producing a hermetic package according to the embodiment of the present invention preferably comprises using, as the member to be housed, a piezoelectric vibrator element or a resin having dispersed therein phosphor particles (quantum dots).

Tenthly, a hermetic package according to one embodiment of the present invention is preferably produced by the above-mentioned method of producing a hermetic package.

DESCRIPTION OF EMBODIMENTS

A method of producing a hermetic package of the present invention comprises a step of preparing a first glass substrate and forming a first sealing material layer on the first glass substrate. Various glass substrates may be used as the first glass substrate, and for example, alkali-free glass, borosilicate glass, aluminosilicate glass, or the like may be used. The first glass substrate has a thickness of preferably from 0.01 mm to 0.7 mm, particularly preferably from 0.05 mm to 0.5 mm. With this, a reduction in thickness of a hermetic package can be achieved. The glass substrate has the features of being easily reduced in thickness, having light transmission properties, and having high surface smoothness.

A method of forming the first sealing material layer is preferably a method of applying a paste containing a first sealing material onto the first glass substrate, followed by firing. With this, bonding strength between the first glass substrate and the first sealing material layer can be increased. In addition, the thickness of the first sealing material layer can be reduced. Herein, from the viewpoint of productivity, the application of the paste is preferably performed by screen printing, and the firing is preferably performed with an electric furnace. The firing temperature is preferably equal to or less than the temperature limit of the first glass substrate, for example, 650° C. or less. From the viewpoint of increasing a reaction depth in the first sealing material layer, the firing temperature is preferably, for example, 480° C. or more.

The paste containing a first sealing material is preferably applied along an outer peripheral edge of the first glass substrate. With this, a housing volume that allows housing in the frame body can be increased.

Various materials may be used as the first sealing material, and for example, composite powder of glass powder and refractory filler powder may be used. Various materials may be used as the glass powder, and for example, bismuth-based glass, tin phosphate-based glass, vanadium-based glass, and the like may be used. From the viewpoints of thermal stability and depth of a reaction layer, bismuth-based glass is preferred. The "tin phosphate-based glass" refers to glass comprising SnO and $P_2O_5$ as a main component, and specifically refers to glass comprising 40 mass % or more of SnO and $P_2O_5$ in total in a glass composition. The "vanadium-based glass" refers to glass comprising $V_2O_5$ as a main component, and specifically refers to glass comprising 25 mass % or more of $V_2O_5$ in total in a glass composition.

In particular, it is preferred to use, as the first sealing material, a sealing material comprising 55 vol % to 95 vol % of bismuth-based glass powder and 5 vol % to 45 vol % of refractory filler powder, and it is more preferred to use, as the first sealing material, a sealing material comprising 70 vol % to 90 vol % of bismuth-based glass powder and 10 vol % to 30 vol % of refractory filler powder. When the refractory filler powder is introduced, the thermal expansion coefficient of the first sealing material is reduced. As a result, the thermal expansion coefficients of the first sealing material layer, the frame body, and the first glass substrate easily match one another.

The bismuth-based glass powder contained in the first sealing material comprises as a glass composition, in terms of mass %, preferably 55% to 74% of $Bi_2O_3$, 5% to 25% of $B_2O_3$, 5% to 20% of ZnO, 0% to 10% of $SiO_2$, and 0% to 5% of $Al_2O_3$, particularly preferably 55% to 69% of $Bi_2O_3$, 10% to 22% of $B_2O_3$, 5% to 20% of ZnO, more than 1% to 10% of $SiO_2$, 1% to 3.7% of $Al_2O_3$, and 0% to 5% of CuO. With this, thermal stability of bismuth-based glass is improved, and further, the thermal expansion coefficient of the bismuth-based glass is reduced. As a result, the thermal expansion coefficients of the first sealing material layer, the frame body, and the first glass substrate easily match one another.

As the refractory filler powder, one kind or two or more kinds selected from cordierite, zircon, tin oxide, niobium oxide, zirconium phosphate-based ceramic, and willemite are preferably used. Those refractory filler powders each have a low thermal expansion coefficient and a high mechanical strength, and besides are each well compatible with the bismuth-based glass. Among the refractory filler powders described above, cordierite is most preferred. Cordierite has a property of causing the bismuth-based glass to less devitrify at the time of laser sealing while having a small particle diameter. Other than the refractory filler powders described above, β-eucryptite, quartz glass, or the like may be added.

The average particle diameter $D_{50}$ of the refractory filler powder is preferably less than 2 μm, particularly preferably less than 1.5 μm. When the average particle diameter $D_{50}$ of the refractory filler powder is less than 2 μm, the surface smoothness of the sealing material layer is improved, and the average thickness of the sealing material layer is easily controlled to less than 10 μm.

The maximum particle diameter $D_{99}$ of the refractory filler powder is preferably less than 5 μm or 4 μm or less, particularly preferably 3 μm or less. When the maximum particle diameter $D_{99}$ of the refractory filler powder is less than 5 μm, the surface smoothness of the sealing material layer is improved, and the average thickness of the sealing material layer is easily controlled to less than 10 μm. Herein, the "average particle diameter $D_{50}$" and the "maximum particle diameter $D_{99}$" each refer to a value measured by laser diffractometry on a volume basis.

The paste is generally produced by kneading the sealing material and a vehicle with a triple roller or the like. The vehicle generally contains a resin and a solvent. As the resin to be used in the vehicle, there may be used, for example, an acrylate (acrylic resin), ethylcellulose, a polyethylene glycol derivative, nitrocellulose, polymethylstyrene, polyethylene carbonate, polypropylene carbonate, or a methacrylate. As the solvent to be used in the vehicle, there may be used, for example, N,N'-dimethylformamide (DMF), α-terpineol, a higher alcohol, γ-butyrolactone (γ-BL), tetralin, butyl carbitol acetate, ethyl acetate, isoamyl acetate, diethylene glycol monoethyl ether, diethylene glycol monoethyl ether acetate, benzyl alcohol, toluene, 3-methoxy-3-methylbutanol, triethylene glycol monomethyl ether, triethylene glycol dimethyl ether, dipropylene glycol monomethyl ether, dipropylene glycol monobutyl ether, tripropylene glycol monomethyl ether, tripropylene glycol monobutyl ether, propylene carbonate, dimethyl sulfoxide (DMSO), or N-methyl-2-pyrrolidone.

The method of producing a hermetic package of the present invention comprises a step of preparing a frame body having an opening on top thereof and arranging the frame body and the first glass substrate so that a bottom portion of the frame body and the first sealing material layer are brought into contact with each other, followed by sealing the frame body and the first glass substrate with each other through intermediation of the first sealing material layer.

A material of the frame body is not particularly limited, but from the viewpoints of material cost and sintering strength, alumina, zirconia, mullite, or the like is preferred. In addition, a sintered body of a green sheet is preferred as well, and a sintered body of a green sheet laminate formed of composite powder containing crystalline glass powder and refractory filler powder is particularly preferred. The use of the sintered body of a green sheet has the advantage of easy production of the frame body with high dimensional accuracy.

The sealing of the frame body and the first glass substrate is preferably performed through firing with an electric furnace or the like. With this, sealing strength between the frame body and the first glass substrate can be increased. The firing temperature is preferably equal to or less than the temperature limits of the frame body and the first glass substrate, for example, 650° C. or less. From the viewpoint of increasing a reaction depth in the first sealing material layer, the firing temperature is preferably, for example, 480° C. or more.

The method of producing a hermetic package of the present invention comprises a step of forming a second sealing material layer on an upper edge portion of the frame body. In this case, the upper edge portion of the frame body is preferably subjected to polishing treatment. The upper edge portion of the frame body has a surface roughness Ra of preferably less than 0.5 μm or 0.2 μm or less, particularly preferably less than 0.01 μm to 0.15 μm. The upper edge portion of the frame body has a surface roughness RMS of preferably less than 1.0 μm or 0.5 μm or less, particularly preferably from 0.05 µm to 0.3 µm. With this, surface smoothness of the second sealing material layer is improved, and hence accuracy of the laser sealing can be improved. As a result, sealing strength of the hermetic package in its entirety can be increased. The "surface roughness Ra" and the "surface roughness RMS" may be measured with, for example, a contact-type or noncontact-type laser film thickness meter or surface roughness meter.

A method of forming the second sealing material layer is preferably a method of applying a paste containing a second sealing material onto the frame body, followed by firing. With this, bonding strength between the frame body and the second sealing material layer can be increased. In addition, the thickness of the second sealing material layer can be reduced. Herein, from the viewpoint of productivity, the application of the paste is preferably performed by screen printing, and the firing is preferably performed with an electric furnace. The firing temperature is preferably equal to or less than the temperature limit of the second glass substrate, for example, 550° C. or less. From the viewpoint of increasing a reaction depth in the second sealing material layer, the firing temperature is preferably, for example, 460° C. or more.

Various materials may be used as the second sealing material, and for example, composite powder containing glass powder and refractory filler powder and further containing a heat-resistant pigment may be used. Various materials may be used as the glass powder, and for example, bismuth-based glass, tin phosphate-based glass, vanadium-based glass, and the like may be used. From the viewpoints of thermal stability and depth of a reaction layer, bismuth-based glass is preferred.

In particular, it is preferred to use, as the second sealing material, a sealing material comprising 55 vol % to 95 vol % of bismuth-based glass powder, 5 vol % to 45 vol % of refractory filler powder, and 1 vol % to 15 vol % of a heat-resistant pigment, and it is more preferred to use, as the second sealing material, a sealing material comprising 65 vol % to 80 vol % of bismuth-based glass powder, 20 vol % to 35 vol % of refractory filler powder, and 3 vol % to 10 vol % of a heat-resistant pigment. When the refractory filler powder is introduced, the thermal expansion coefficient of the second sealing material is reduced. As a result, the thermal expansion coefficients of the second sealing material layer, the frame body, and the second glass substrate easily match one another. Further, when the heat-resistant pigment is introduced, laser light absorption properties can be improved.

The bismuth-based glass powder contained in the second sealing material comprises as a glass composition, in terms of mass %, preferably 70% to 85% of $Bi_2O_3$, 5% to 15% of $B_2O_3$, 0% to 15% of ZnO, 0% to 10% of BaO, 0% to 3% of $Al_2O_3$, 3% to 15% of CuO, and 0% to 5% of $Fe_2O_3$, particularly preferably 74% to 85% of $Bi_2O_3$, 5% to 15% of $B_2O_3$, 0% to 10% of ZnO, 1% to 10% of BaO, 0% to 3% of $Al_2O_3$, 5% to 15% of CuO, and 0.1% to 5% of $Fe_2O_3$. With this, the thermal stability of bismuth-based glass is improved, and further, the laser light absorption properties are improved.

Suitable refractory filler powder is the refractory filler powder described above.

The heat-resistant pigment is suitably, for example, a Cu-based oxide, an Fe-based oxide, a Cr-based oxide, a Mn-based oxide, or a spinel-type composite oxide thereof. In particular, from the viewpoint of compatibility with the bismuth-based glass, a Mn-based oxide is preferred.

In the second sealing material layer after its formation on the upper edge portion of the frame body, the surface roughness Ra is preferably controlled to less than 0.5 µm or 0.2 µm or less, particularly within a range of from 0.01 µm to 0.15 µm, and the surface roughness RMS is preferably controlled to less than 1.0 µm or 0.5 µm or less, particularly within a range of from 0.05 µm to 0.3 µm. With this, adhesiveness between the second glass substrate and the second sealing material layer is increased, and hence the accuracy of the laser sealing is improved. The surface roughness Ra of the second sealing material layer may be reduced by polishing the upper edge portion of the frame body or the surface of the second sealing material layer.

The average thickness of the second sealing material layer is controlled to preferably less than 10 µm or less than 7 µm, particularly preferably less than 6 µm. As the average thickness of the second sealing material layer becomes smaller, a stress remaining in the sealed sites after the laser sealing is reduced more even when the thermal expansion coefficients of the second sealing material layer, the frame body, and the second glass substrate do not match one another sufficiently. In addition, also the accuracy of the laser sealing can be improved.

The width of the second sealing material layer is controlled within a range of preferably from 0.05 mm to 1 mm, particularly preferably from 0.1 mm to 0.5 mm. When the width of the second sealing material layer is too small, the accuracy of the laser sealing is liable to lower. Meanwhile, when the width of the second sealing material layer is too large, the dimensions of a member to be housed that can be housed in the frame body are reduced, with the result that the performance of the hermetic package is liable to lower.

The same kind of material may be used as the first sealing material (first sealing material layer) and the second sealing material (second sealing material layer), but different kinds of materials are preferably used as these materials. In particular, it is preferred that the thermal expansion coefficient of the first sealing material be lower than the thermal expansion coefficient of the second sealing material, more preferably by $5\times10^{-7}$/° C. or more, still more preferably by $10\times10^{-7}$/° C. or more, particularly preferably by $15\times10^{-7}$/° C. or more. When the thermal expansion coefficient of the first sealing material is higher than the thermal expansion coefficient of the second sealing material, an improper stress is liable to remain in the hermetic package in its entirety.

It is preferred that the softening point of the second sealing material be lower than the softening point of the first sealing material, more preferably by 30° C. or more, still more preferably by 50° C. or more, particularly preferably by 80° C. or more. When the softening point of the second sealing material is higher than the softening point of the first sealing material, it becomes difficult to generate the reaction layer through the laser sealing.

It is preferred that the average thickness of the second sealing material layer be smaller than the average thickness of the first sealing material layer, more preferably by 1 µm or more, still more preferably by 2 µm or more, particularly preferably by 3 µm or more. When the average thickness of the second sealing material layer is larger than the average thickness of the first sealing material layer, it becomes difficult to form the first sealing material layer through the firing or the like and improve the accuracy of the laser sealing.

The method of producing a hermetic package of the present invention comprises a step of housing, in the frame body, a member to be housed. As the member to be housed, a low heat-resistant member is preferred, and a piezoelectric vibrator element or a resin having dispersed therein phosphor particles, such as quantum dots, is particularly preferred. When a resin having dispersed therein quantum dots is used, the resin may be cured after being housed in the frame body, or an already-cured resin may be housed.

The method of producing a hermetic package of the present invention comprises a step of preparing a second glass substrate and arranging the second glass substrate so that the second glass substrate and the second sealing material layer are brought into contact with each other, followed by sealing the second glass substrate and the frame body with each other through intermediation of the second sealing material layer by irradiating the second sealing material layer with laser light from a second glass substrate side, to thereby provide a hermetic package.

Various glasses may be used as the second glass substrate. For example, alkali-free glass, borosilicate glass, or aluminosilicate glass may be used. The thickness of the second glass substrate is preferably from 0.01 mm to 0.7 mm, particularly preferably from 0.05 mm to 0.5 mm. With this, the thickness of the hermetic package can be reduced.

Various lasers may be used as the laser. In particular, a semiconductor laser, a YAG laser, a $CO_2$ laser, an excimer laser, an infrared laser, and the like are particularly preferred because those lasers are easy to handle.

The output of the laser light is preferably from 5 W to 20 W, particularly preferably from 8 W to 15 W. When the output of the laser light is too low, sealing strength between the frame body and the second glass substrate is liable to lower. Meanwhile, when the output of the laser light is too high, the second glass substrate is liable to be broken after the laser sealing.

The scanning speed of the laser light is preferably from 5 mm/s to 20 mm/s, particularly preferably from 8 mm/s to 15 mm/s. When the scanning speed of the laser light is too low, productivity of the hermetic package is liable to lower. Meanwhile, when the scanning speed of the laser light is too high, the sealing strength between the frame body and the second glass substrate is liable to lower.

An atmosphere for performing the laser sealing is not particularly limited. An air atmosphere or an inert atmosphere, such as a nitrogen atmosphere, may be adopted.

Embodiments of the hermetic package of the present invention are described below with reference to the drawings.

Figure 1A:
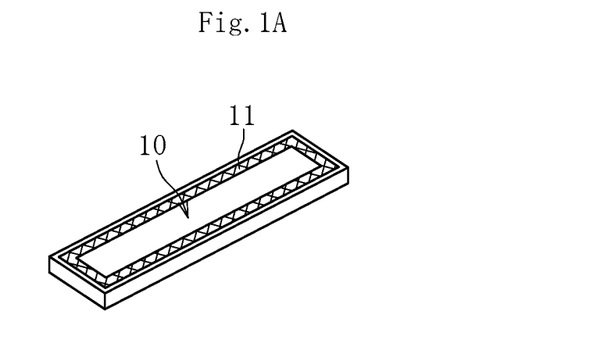
FIG. 1A is a conceptual perspective view for illustrating one embodiment of a method of producing a hermetic package of the present invention.
Figure 1B:
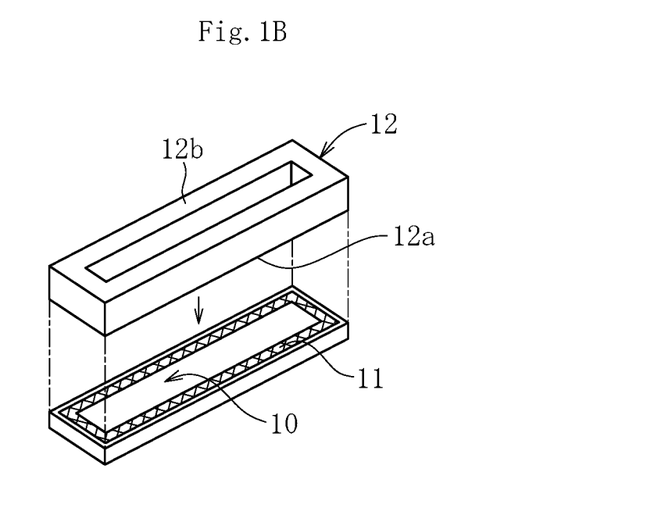
FIG. 1B is a conceptual perspective view for illustrating one embodiment of a method of producing a hermetic package of the present invention.
Figure 1C:
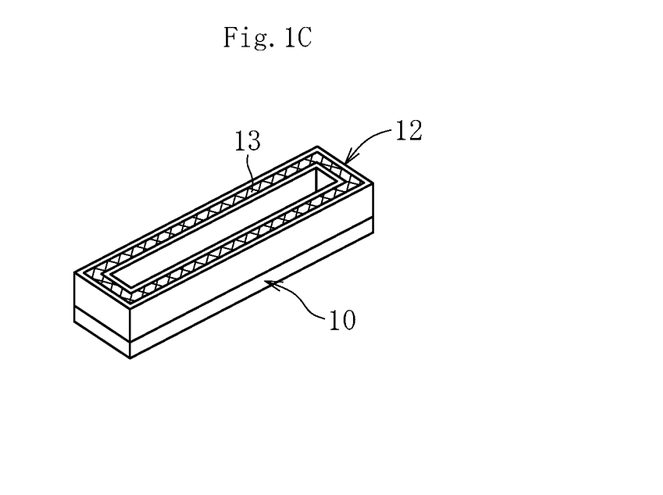
FIG. 1C is a conceptual perspective view for illustrating one embodiment of a method of producing a hermetic package of the present invention.
Figure 1D:
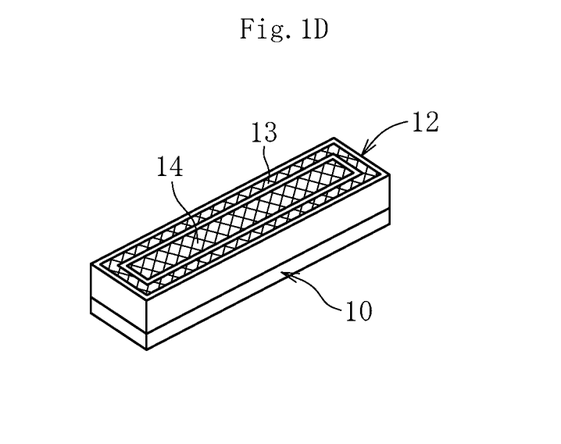
FIG. 1D is a conceptual perspective view for illustrating one embodiment of a method of producing a hermetic package of the present invention.
Figure 1E:
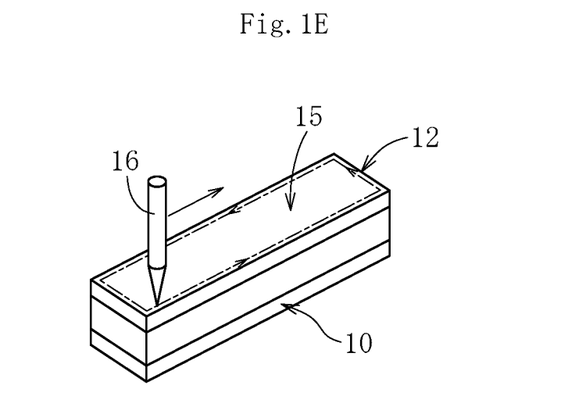
FIG. 1E is a conceptual perspective view for illustrating one embodiment of a method of producing a hermetic package of the present invention.

FIG. 1 are conceptual perspective views for illustrating one embodiment of a method of producing a hermetic package 1 of the present invention. First, as illustrated in FIG. 1A, a first glass substrate 10 is prepared, and then a first sealing material layer 11 is formed into a frame shape along an outer peripheral edge of the first glass substrate 10. Herein, the formation of the first sealing material layer 11 is preferably performed through firing with an electric furnace or the like. Next, as illustrated in FIG. 1B, a frame body 12 having an opening on top thereof is prepared, and the frame body 12 and the first glass substrate 10 are arranged so that a bottom portion 12a of the frame body 12 and the first sealing material layer 11 are brought into contact with each other, and then the frame body 12 and the first glass substrate 10 are sealed with each other through intermediation of the first sealing material layer 11. Herein, the frame body 12 is preferably a sintered body of a green sheet laminate formed of composite powder containing glass powder and refractory filler powder. In addition, the sealing of the frame body 12 and the first glass substrate 10 is preferably performed through firing with an electric furnace or the like. Further, as illustrated in FIG. 1C, a second sealing material layer 13 is formed on an upper edge portion 12b of the frame body 12. Herein, the upper edge portion 12b of the frame body 12 is preferably smoothened through polishing treatment or the like so as to have a surface roughness Ra of 0.15 μm or less. In addition, the formation of the second sealing material layer 13 is preferably performed through firing with an electric furnace or the like, and besides, the surface roughness Ra of the second sealing material layer 13 is preferably controlled to 0.15 μm or less. Moreover, as illustrated in FIG. 1D, a member 14 to be housed is housed in the frame body 12. Herein, the member 14 to be housed is preferably a low heat-resistant member, particularly preferably a piezoelectric vibrator element or a resin having dispersed therein quantum dots. Finally, as illustrated in FIG. 1E, a second glass substrate 15 is prepared, and the second glass substrate 15 is arranged so that the second glass substrate 15 and the second sealing material layer 13 are brought into contact with each other, and then the second glass substrate 15 and the frame body 12 are sealed with each other through intermediation of the second sealing material layer 13 by irradiating the second sealing material layer 13 with laser light 16 from a second glass substrate 15 side. Thus, a hermetic package 1 can be obtained.

Example 1

Now, the present invention is described in detail by way of Examples. The following Examples are merely illustrative. The present invention is by no means limited to the following Examples.

First, a first sealing material was produced. The material composition of the first sealing material is shown in Table 1. The bismuth-based glass comprises as a glass composition, in terms of mass %, 56.4% of $Bi_2O_3$, 17.9% of $B_2O_3$, 15.7% of ZnO, 6.4% of $SiO_2$, and 6.4% of $Al_2O_3$, and has particle sizes shown in Table 1. The refractory filler powder is cordierite powder and has a particle size shown in Table 1.

TABLE 1

| | | |
|---|---|---|
| Bismuth-based glass (vol %) | | 85 |
| Refractory filler (vol %) | | 15 |
| Bismuth-based glass | $D_{50}$ | 1.8 |
| particle size (μm) | $D_{99}$ | 6.5 |
| Refractory filler | $D_{50}$ | 1.0 |
| particle size (μm) | $D_{99}$ | 2.8 |
| Glass transition point (° C.) | | 480 |
| Softening point (° C.) | | 555 |
| Thermal expansion coefficient [30-300° C.] (×$10^{-7}$/° C.) | | 60 |

The above-mentioned bismuth-based glass and refractory filler powder were mixed at a ratio shown in Table 1 to produce a first sealing material. The first sealing material was measured for a glass transition point, a softening point, and a thermal expansion coefficient. The results are shown in Table 1.

The glass transition point refers to a value measured with a push-rod-type TMA apparatus.

The softening point refers to a temperature at a fourth inflection point measured with a macro-type DTA apparatus. The measurement was performed under an air atmosphere in the range of from room temperature to 600° C. at a temperature increase rate of 10° C./min.

The thermal expansion coefficient refers to a value measured with a push-rod-type TMA apparatus. The range of measurement temperatures is from 30° C. to 300° C.

Next, a second sealing material was produced. The material composition of the second sealing material is shown in Table 2. The bismuth-based glass comprises as a glass composition, in terms of mass %, 77.7% of $Bi_2O_3$, 8.3% of $B_2O_3$, 1.8% of ZnO, 2.7% of BaO, 8.5% of CuO, 0.5% of $Fe_2O_3$, and 0.5% of $Al_2O_3$, and has particle sizes shown in Table 2. The refractory filler powder is cordierite powder and has a particle size shown in Table 2. The heat-resistant pigment is a composite oxide containing $MnO_2$, $Fe_2O_3$, and $Al_2O_3$ at a ratio of 54 mass %, 44 mass %, and 2 mass %, respectively, and has a particle size shown in Table 2.

TABLE 2

| | | |
|---|---|---|
| Bismuth-based glass (vol %) | | 71 |
| Refractory filler (vol %) | | 25 |
| Heat-resistant pigment (vol %) | | 4 |
| Bismuth-based glass | $D_{50}$ | 1.0 |
| particle size (μm) | $D_{99}$ | 3.2 |
| Refractory filler | $D_{50}$ | 1.0 |
| particle size (μm) | $D_{99}$ | 2.8 |
| Heat-resistant pigment | $D_{50}$ | 1.0 |
| particle size (μm) | $D_{99}$ | 2.9 |
| Glass transition point (° C.) | | 380 |
| Softening point (° C.) | | 450 |
| Thermal expansion coefficient [30-300° C.] (×$10^{-7}$/° C.) | | 78 |

The above-mentioned bismuth-based glass, refractory filler powder, and heat-resistant pigment were mixed at a ratio shown in Table 2 to produce a second sealing material. The second sealing material was measured for a glass transition point, a softening point, and a thermal expansion coefficient. The results are shown in Table 2.

Next, a first glass substrate (OA-10G, manufactured by Nippon Electric Glass Co., Ltd.) was prepared. The dimensions of the first glass substrate are 6.0 mm×1.7 mm×0.1 mm in thickness. Further, the first sealing material shown in Table 1 and a vehicle were kneaded so as to have a viscosity of about 100 Pa·s (25° C., Shear rate: 4), and then further kneaded with a triple roll mill until the powders were uniformly dispersed, to provide a paste. An ethylcellulose resin dissolved in a glycol ether-based solvent was used as the vehicle. The resultant paste containing the first sealing material was printed into a frame shape along the outer peripheral edge of the first glass substrate so as to have a width of about 0.2 mm with a screen printer. Then, the resultant was subjected to drying at 120° C. for 10 minutes under the air atmosphere, followed by firing at 620° C. for 10 minutes under the air atmosphere, to thereby incinerate a resin component in the paste (binder removal treatment) and sinter the first sealing material. Thus, a first sealing material layer was formed on the first glass substrate. The average thickness of the first sealing material layer was measured with a noncontact-type laser film thickness meter, and as a result, was found to be about 10 μm.

Subsequently, a frame body having an opening on top thereof formed of a sintered body of a green sheet laminate (material: MLS-26A, manufactured by Nippon Electric Glass Co., Ltd.) was prepared. The dimensions of the frame body are as follows: 6.0 mm×1.7 mm in outer dimensions; 5.4 mm×1.1 mm in inner dimensions; and 0.6 mm in thickness. Then, the frame body and the first glass substrate were arranged so that the bottom portion of the frame body and the first sealing material layer were brought into contact with each other, and then the frame body and the first glass substrate were sealed with each other through firing at 620° C. for 10 minutes. Further, the second sealing material shown in Table 2 and a vehicle were kneaded so as to have a viscosity of about 100 Pa·s (25° C., Shear rate: 4), and then further kneaded with a triple roll mill until the powders were uniformly dispersed, to provide a paste. An ethylcellulose resin dissolved in a glycol ether-based solvent was used as the vehicle. The resultant paste containing the second sealing material was printed on the upper edge portion of the frame body so as to have a width of about 0.2 mm with a screen printer. Then, the resultant was subjected to drying at 120° C. for 10 minutes under the air atmosphere, followed by firing at 510° C. for 10 minutes under the air atmosphere, to thereby incinerate a resin component in the paste (binder removal treatment) and sinter the second sealing material. Thus, a second sealing material layer was formed on the upper edge portion of the frame body. The average thickness of the second sealing material layer was measured with a noncontact-type laser film thickness meter, and as a result, was found to be about 6 μm.

Further, a resin having dispersed therein quantum dots was potted in the frame body and cured.

In addition, a second glass substrate (OA-10G, manufactured by Nippon Electric Glass Co., Ltd.) was prepared. The dimensions of the second glass substrate are 6.0 mm×1.7 mm×0.1 mm in thickness.

After that, the second glass substrate was arranged so that the second glass substrate and the second sealing material layer were brought into contact with each other, and then the second glass substrate and the frame body were sealed with each other through intermediation of the second sealing material layer by irradiating the second sealing material layer with laser light having a wavelength of 808 nm from a second glass substrate side. Thus, a hermetic package was obtained. The irradiation speed and output of the laser light were set to 10 mm/s and 10 W, respectively.

The resultant hermetic package was observed with a microscope at around the second sealing material layer, and as a result, separation and cracks were not observed (evaluation of adhesive property). Further, the resultant hermetic package was subjected to a highly accelerated temperature and humidity stress test (HAST), and then observation was performed on the frame body and the second glass substrate. As a result, separation between those components was not observed. The result shows that the sealing strength between the frame body and the second glass substrate is high. The HAST conditions are as follows: 121° C., a humidity of 100%, 2 atm, and 24 hours.

Example 2

Hermetic packages (Sample Nos. 1 to 6) shown in Table 3 were each produced on the same conditions as in [Example 1] except for the conditions of the materials of the second glass substrate and the frame body and the laser sealing. Further, Sample Nos. 1 to 6 were each subjected to the evaluation of adhesive property and the evaluation using HAST described above. As a result, Sample Nos. 1 to 6 were each good in the evaluation of adhesive property and the evaluation using HAST. In Table 3, the "Alkali-free glass" represents OA-10G manufactured by Nippon Electric Glass Co., Ltd., the "Alkali borosilicate glass" represents BLC manufactured by Nippon Electric Glass Co., Ltd., and the "LTCC" represents a sintered body of a green sheet laminate (material: MLS-26A, manufactured by Nippon Electric Glass Co., Ltd.).

TABLE 3

|  | No. 1 | No. 2 | No. 3 | No. 4 | No. 5 | No. 6 |
|---|---|---|---|---|---|---|
| Second glass substrate | Alkali-free glass | Alkali-free glass | Alkali borosilicate glass | Alkali-free glass | Alkali-free glass | Alkali borosilicate glass |
| Frame body | Alumina | Alumina | Alumina | LTCC | LTCC | LTCC |
| Sealing material layer Average thickness (μm) | 5 | 8 | 6 | 5 | 8 | 6 |
| Laser light Output (W) | 14 | 10 | 12 | 13 | 8 | 11 |
| Scanning speed (mm/s) | 11 | 11 | 8 | 11 | 11 | 8 |
| Adhesive property | ○ | ○ | ○ | ○ | ○ | ○ |
| HAST | ○ | ○ | ○ | ○ | ○ | ○ |

Comparative Example

In addition, a hermetic package (Sample No. 7) was produced on the same conditions as in [Example 1] except that a second sealing material layer was formed on the second glass substrate through firing with an electric furnace, instead of on the upper edge portion of the frame body. Further, Sample No. 7 was subjected to the evaluation of adhesive property described above. As a result, for Sample No. 7, separation was observed in the evaluation of adhesive property.

REFERENCE SIGNS LIST 1 hermetic package
10 first glass substrate
11 first sealing material layer
12 frame body
12a bottom portion of frame body
12b upper edge portion of frame body
13 second sealing material layer
14 member to be housed
15 second glass substrate
16 laser light

The invention claimed is:

1. A method of producing a hermetic package, the method comprising the steps of:
preparing a first glass substrate and forming a first sealing material layer on the first glass substrate;
preparing a frame body having an opening on top thereof and arranging the frame body and the first glass substrate so that a bottom portion of the frame body and the first sealing material layer are brought into contact with each other, followed by sealing the frame body and the first glass substrate with each other through intermediation of the first sealing material layer;
forming a second sealing material layer on an upper edge portion of the frame body after sealing the frame body and the first glass substrate with each other through intermediation of the first sealing material layer;
housing, in the frame body, a member to be housed after forming the second sealing material layer on the upper edge portion of the frame body; and
preparing a second glass substrate and arranging the second glass substrate so that the second glass substrate and the second sealing material layer are brought into contact with each other, followed by sealing the second glass substrate and the frame body with each other through intermediation of the second sealing material layer by irradiating the second sealing material layer with laser light from a second glass substrate side, to thereby provide a hermetic package.

2. The method of producing a hermetic package according to claim 1, wherein the forming of the first sealing material layer comprises applying a paste containing a first sealing material onto the first glass substrate, followed by firing, to thereby form a first sealing material layer formed of a sintered body of the first sealing material.

3. The method of producing a hermetic package according to claim 2, wherein the method further comprises using, as a first sealing material, a sealing material comprising 55 vol % to 95 vol % of bismuth-based glass powder and 5 vol % to 45 vol % of refractory filler powder.

4. The method of producing a hermetic package according to claim 3, wherein the method further comprises using, as the frame body, a sintered body of a green sheet.

5. The method of producing a hermetic package according to claim 3, wherein the sealing of the frame body and the first glass substrate with each other comprises firing the first sealing material layer.

6. The method of producing a hermetic package according to claim 2, wherein the method further comprises using, as the frame body, a sintered body of a green sheet.

7. The method of producing a hermetic package according to claim 2, wherein the sealing of the frame body and the first glass substrate with each other comprises firing the first sealing material layer.

8. The method of producing a hermetic package according to claim 6, wherein the sealing of the frame body and the first glass substrate with each other comprises firing the first sealing material layer.

9. The method of producing a hermetic package according to claim 1, wherein the method further comprises using, as a first sealing material, a sealing material comprising 55 vol % to 95 vol % of bismuth-based glass powder and 5 vol % to 45 vol % of refractory filler powder.

10. The method of producing a hermetic package according to claim 9, wherein the method further comprises using, as the frame body, a sintered body of a green sheet.

11. The method of producing a hermetic package according to claim 10, wherein the sealing of the frame body and the first glass substrate with each other comprises firing the first sealing material layer.

12. The method of producing a hermetic package according to claim 9, wherein the sealing of the frame body and the first glass substrate with each other comprises firing the first sealing material layer.

13. The method of producing a hermetic package according to claim 1, wherein the method further comprises using, as the frame body, a sintered body of a green sheet.

14. The method of producing a hermetic package according to claim 13, wherein the sealing of the frame body and the first glass substrate with each other comprises firing the first sealing material layer.

15. The method of producing a hermetic package according to claim 1, wherein the forming of the second sealing material layer comprises applying a paste containing a second sealing material onto the upper edge portion of the frame body, followed by firing, to thereby form a second sealing material layer formed of a sintered body of the second sealing material.

16. The method of producing a hermetic package according to claim 15, wherein the method further comprises using, as the second sealing material, a sealing material comprising 55 vol % to 95 vol % of bismuth-based glass powder, 5 vol % to 45 vol % of refractory filler powder, and 1 vol % to 15 vol % of a heat-resistant pigment.

17. The method of producing a hermetic package according to claim 1, wherein the sealing of the frame body and the first glass substrate with each other comprises firing the first sealing material layer.

18. The method of producing a hermetic package according to claim 1, wherein the second sealing material layer has an average thickness of less than 10 μm.

19. The method of producing a hermetic package according to claim 1, wherein the method further comprises using, as the member to be housed, a piezoelectric vibrator element or a resin having dispersed therein phosphor particles.

* * * * *